(12) United States Patent
Koizumi et al.

(10) Patent No.: US 11,791,177 B2
(45) Date of Patent: Oct. 17, 2023

(54) PLACING TABLE INCLUDING HEAT EXCHANGE MEDIUM PATH AND SUBSTRATE PROCESSING APPARATUS THEREOF

(71) Applicant: Tokyo Electron Limited, Tokyo (JP)

(72) Inventors: Katsuyuki Koizumi, Miyagi (JP); Masanori Takahashi, Miyagi (JP); Shota Ezaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 397 days.

(21) Appl. No.: 16/987,650

(22) Filed: Aug. 7, 2020

(65) Prior Publication Data

US 2021/0043476 A1  Feb. 11, 2021

(30) Foreign Application Priority Data

Aug. 9, 2019 (JP) .................. 2019-148134

(51) Int. Cl.
*H01L 21/67* (2006.01)
*H01L 21/687* (2006.01)
*H01L 21/683* (2006.01)
*H01L 21/3065* (2006.01)

(52) U.S. Cl.
CPC .... *H01L 21/67109* (2013.01); *H01L 21/3065* (2013.01); *H01L 21/67248* (2013.01); *H01L 21/6833* (2013.01); *H01L 21/68714* (2013.01)

(58) Field of Classification Search
CPC ........... H01L 21/67109; H01L 21/3065; H01L 21/67248; H01L 21/6833; H01L 21/68714; H01L 21/67063; H01L 21/67103; H01L 21/6831; H01L 21/67098; H01L 21/68785; H01J 37/32715; H01J 37/32724; B23Q 3/15; H02N 13/00

See application file for complete search history.

(56) References Cited

U.S. PATENT DOCUMENTS

| | | | |
|---|---|---|---|
| 10,964,577 B2 * | 3/2021 | Yamaguchi | ....... H01L 21/67248 |
| 2008/0178608 A1 * | 7/2008 | Tandou | ................... F25B 39/02 |
| | | | 62/515 |
| 2016/0118285 A1 * | 4/2016 | Takada | ................ H01L 21/6831 |
| | | | 165/53 |

FOREIGN PATENT DOCUMENTS

| | | |
|---|---|---|
| JP | 2006-261541 A | 9/2006 |
| JP | 2011-151055 A | 8/2011 |
| JP | 5210706 B2 | 6/2013 |
| JP | 5416748 B2 | 2/2014 |
| JP | 2016-082206 A | 5/2016 |

* cited by examiner

*Primary Examiner* — John P. Dulka
(74) *Attorney, Agent, or Firm* — Pearne & Gordon LLP

(57) ABSTRACT

A placing table configured to place a substrate on an electrostatic chuck includes a base; the electrostatic chuck placed on a placing surface of the base; and a path formed within the placing table along the placing surface, and configured to allow a heat exchange medium to flow therein from an inlet opening to an outlet opening of the heat exchange medium. A distance between a top surface of the path and the placing surface is constant from the inlet opening to the outlet opening. A cross sectional shape of the path in a direction perpendicular to the top surface is differed depending on a position in the path.

5 Claims, 8 Drawing Sheets

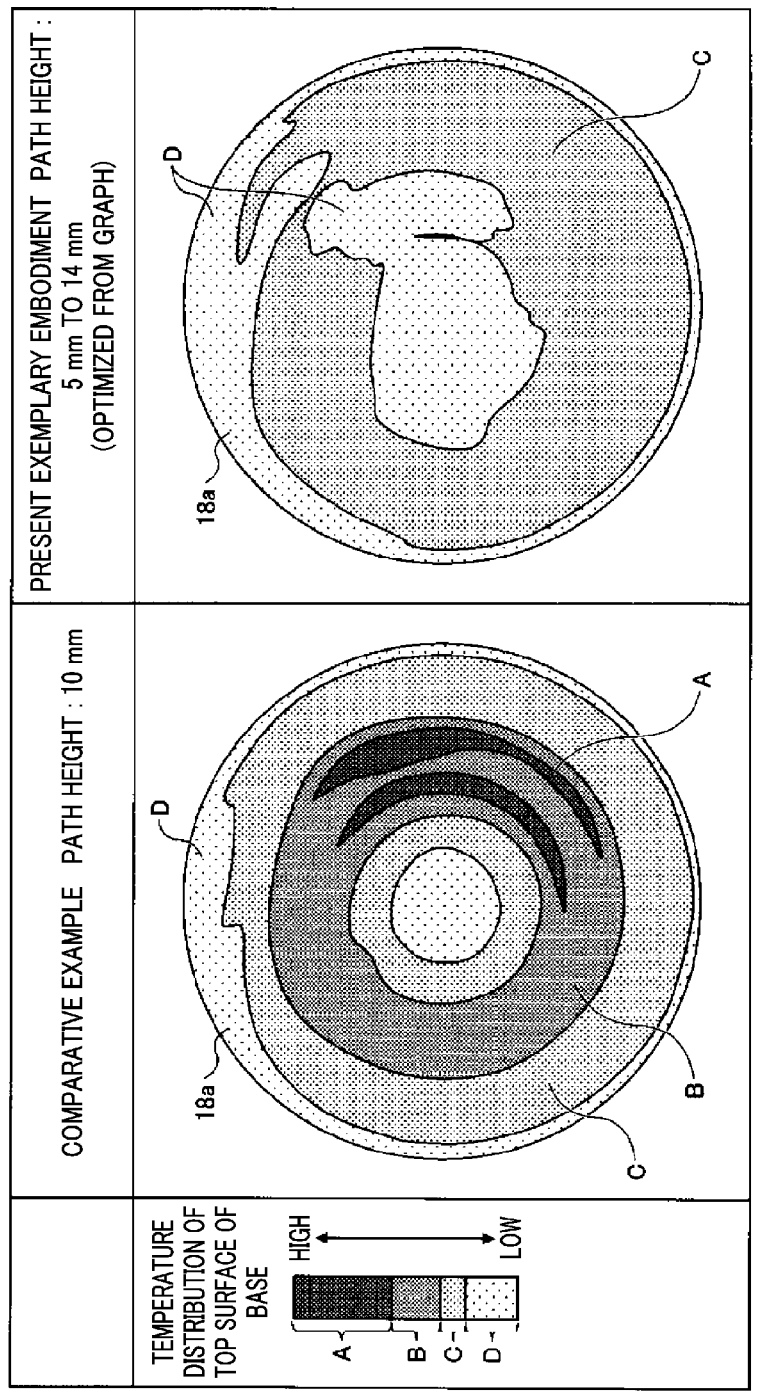

TOP SURFACE FLAT
& HEIGHT ADJUSTMENT

TOP SURFACE
OTHER THAN FLAT
& HEIGHT ADJUSTMENT

TOP SURFACE FLAT
OR HEIGHT CONSTANT
→ SHAPE ADJUSTMENT

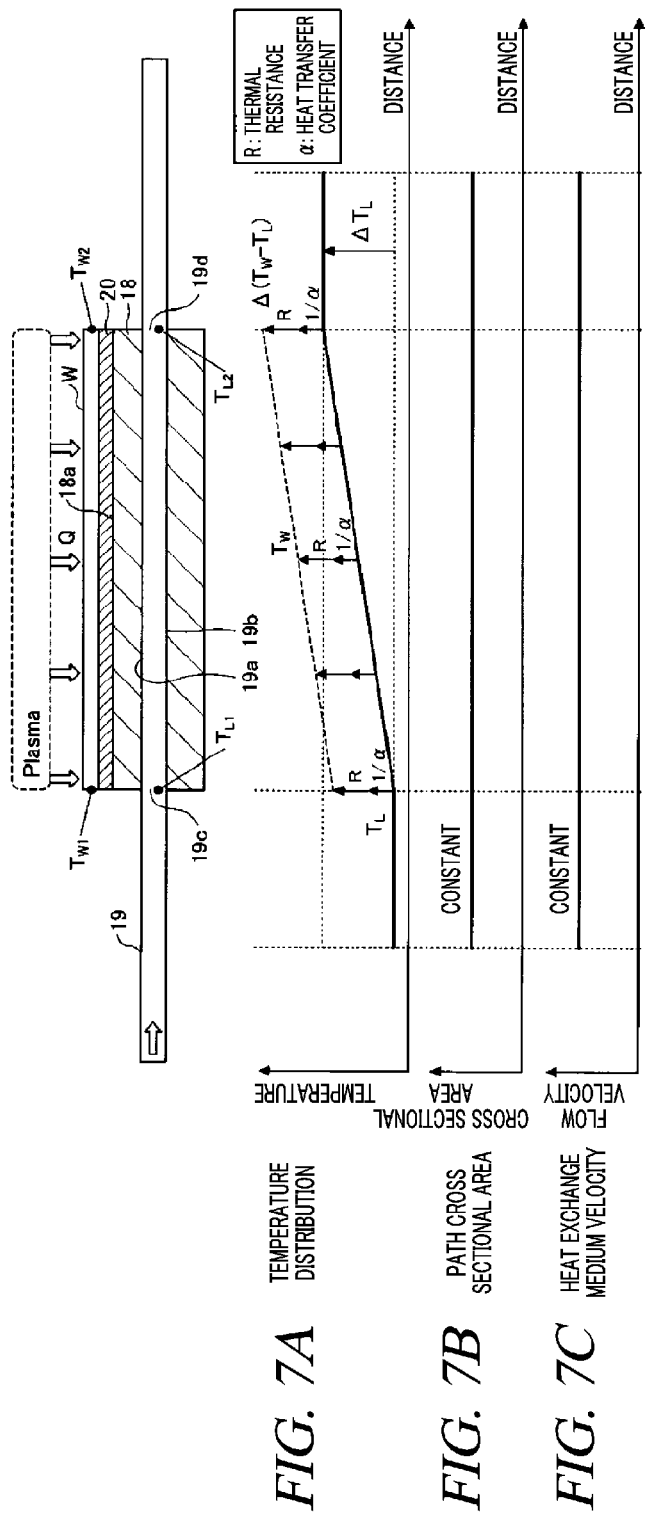

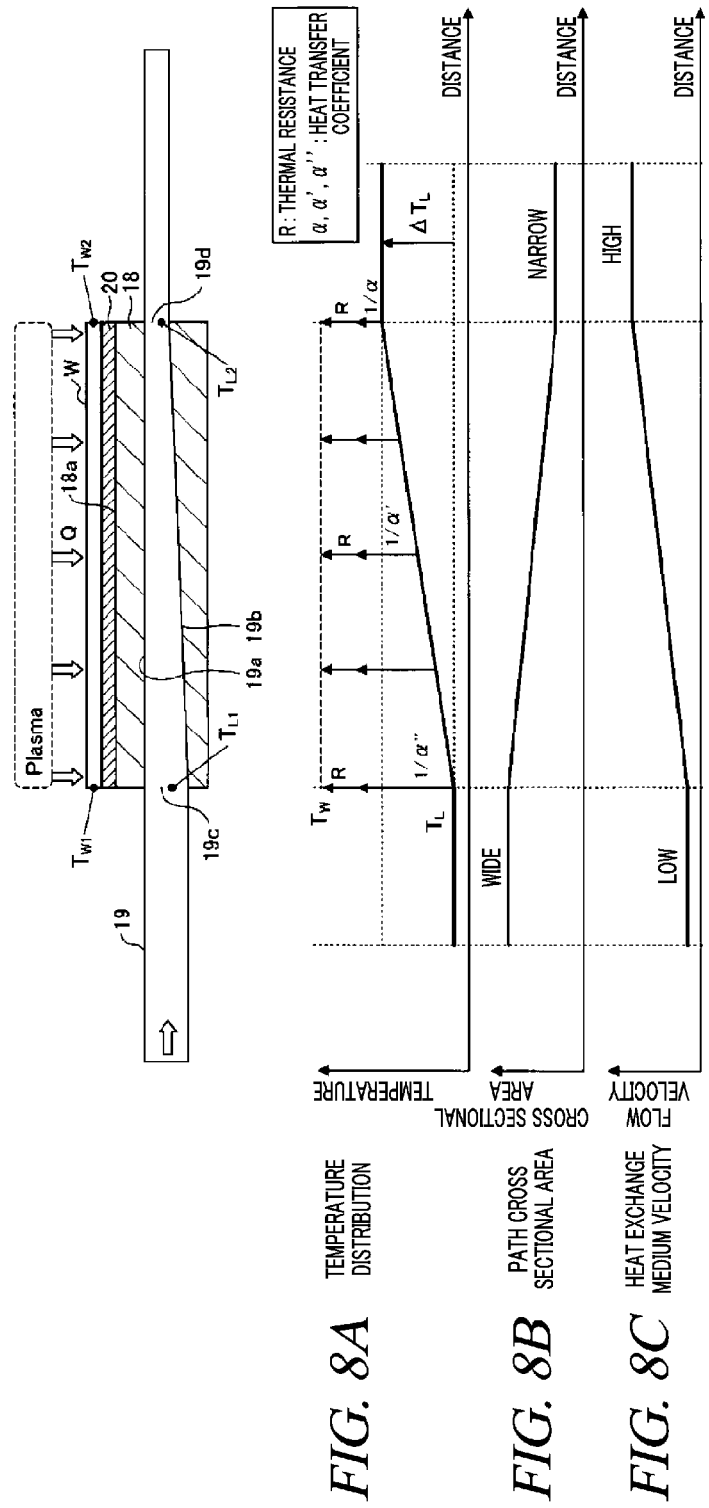
FIG. 8A TEMPERATURE DISTRIBUTION
FIG. 8B PATH CROSS SECTIONAL AREA
FIG. 8C HEAT EXCHANGE MEDIUM VELOCITY

PLACING TABLE INCLUDING HEAT EXCHANGE MEDIUM PATH AND SUBSTRATE PROCESSING APPARATUS THEREOF

CROSS-REFERENCE TO RELATED APPLICATION

This application claims the benefit of Japanese Patent Application No. 2019-148134 filed on Aug. 9, 2019, the entire disclosure of which is incorporated herein by reference.

TECHNICAL FIELD

The various aspects and embodiments described herein pertain generally to a placing table and a substrate processing apparatus.

BACKGROUND

In a substrate processing apparatus, to adjust a temperature of a substrate placed on a placing table, a coolant controlled to a preset temperature is flown into a path provided within the placing table to thereby cool the substrate (for example, Patent Document 1).

In designing the path, since through holes for lift pins or the like are formed within the placing table, the path is designed to avoid the through holes or the like. For this reason, heat removal uniformity may be degraded at a portion of the path formed to avoid the through holes.

Patent Document 1: Japanese Patent Laid-open Publication No. 2006-261541
Patent Document 2: Japanese Patent Laid-open Publication No. 2011-151055
Patent Document 3: Japanese Patent No. 5,210,706
Patent Document 4: Japanese Patent No. 5,416,748

SUMMARY

In one exemplary embodiment, a placing table configured to place a substrate on an electrostatic chuck includes a base; the electrostatic chuck placed on a placing surface of the base; and a path formed within the placing table along the placing surface, and configured to allow a heat exchange medium to flow therein from an inlet opening to an outlet opening of the heat exchange medium. A distance between a top surface of the path and the placing surface is constant from the inlet opening to the outlet opening. A cross sectional shape of the path in a direction perpendicular to the top surface is differed depending on a position in the path.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4A and FIG. 4B are diagrams illustrating a simulation result and optimization of the height of the path according to the exemplary embodiment;

FIG. 7A to FIG. 7C are diagrams illustrating an example of a temperature difference between an inlet opening and an outlet opening of the path and a cross sectional area of the path according to the exemplary embodiment; and FIG. 8A to FIG. 8C are diagrams illustrating an example of a temperature difference between the inlet opening and the outlet opening of the path and the cross sectional area of the path according to the exemplary embodiment.

DETAILED DESCRIPTION

Figure 1:
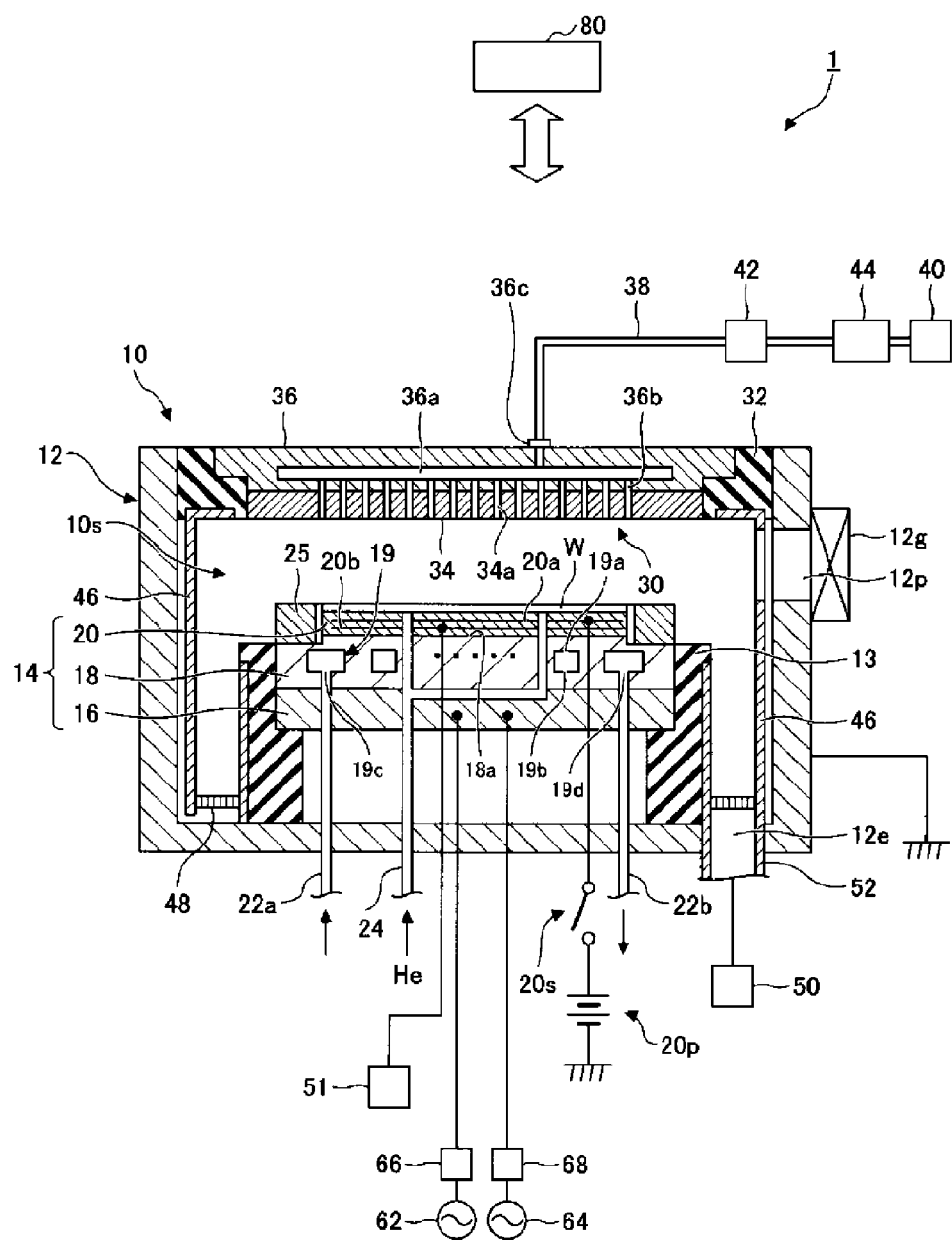
FIG. 1 is a schematic cross sectional diagram illustrating an example of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described in detail with reference to the accompanying drawings. In the various drawing, like parts will be assigned like reference numerals, and redundant description will be omitted.

[Substrate Processing Apparatus].

A substrate processing apparatus 1 according to an exemplary embodiment will be explained with reference to FIG. 1. FIG. 1 is a schematic cross sectional view illustrating an example of the substrate processing apparatus 1 according to the exemplary embodiment.

The substrate processing apparatus 1 is equipped with a chamber 10. The chamber 10 has an internal space 10s therein. The chamber 10 includes a chamber main body 12. The chamber main body 12 has a substantially cylindrical shape. The chamber main body 12 is made of, by way of example, but not limitation, aluminum. A corrosion-resistant film is provided on an inner wall surface of the chamber main body 12. This corrosion-resistant film may be made of ceramic such as aluminum oxide or yttrium oxide.

A passage 12p is formed at a sidewall of the chamber main body 12. The substrate W is transferred between the internal space 10s and an outside of the chamber 10 through the passage 12p. The passage 12p is opened or closed by a gate valve 12g which is provided along the sidewall of the chamber main body 12.

A supporting member 13 is provided on a bottom of the chamber main body 12. The supporting member 13 is made of an insulating material. The supporting member 13 has a substantially cylindrical shape. Within the internal space 10s, the supporting member 13 extends upwards from the bottom of the chamber main body 12. The supporting member 13 has a placing table 14 at an upper portion thereof. The placing table 14 is configured to support the substrate W within the internal space 10s.

The placing table 14 has a base 18 and an electrostatic chuck 20. The placing table 14 may be further equipped with an electrode plate 16. The electrode plate 16 is made of a conductor such as, but not limited to, aluminum and has a substantially disk shape. The base 18 is provided on the electrode plate 16. The base 18 is made of a conductor such as, but not limited to, aluminum and has a substantially disk shape. The base 18 is electrically connected with the electrode plate 16.

The electrostatic chuck 20 is provided on a placing surface 18a of the base 18, and the substrate W is placed on the electrostatic chuck 20. The electrostatic chuck 20 includes a main body, an electrode 20a and a heater 20b. The main body of the electrostatic chuck 20 has a substantially disk shape and is formed of a dielectric material. The electrode 20a of the electrostatic chuck 20 is a film-shaped electrode and provided within the main body of the electrostatic chuck 20. The electrode 20a of the electrostatic chuck 20 is connected to a DC power supply 20p via a switch 20s. If a voltage is applied to the electrode 20a of the electrostatic chuck 20 from the DC power supply 20p, an electrostatic attracting force is generated between the electrostatic chuck 20 and the substrate W. The substrate W is held by the electrostatic chuck 20 by the generated electrostatic attracting force. The heater 20b of the electrostatic chuck 20 is buried under the electrode 20a within the electrostatic chuck 20. The heater 20b is connected to a power supply 51. If a voltage from the power supply 51 is applied to the heater 20b, the heater 20b is heated.

In the present exemplary embodiment, the electrostatic chuck 20 is placed on the placing surface of the base 18, and the substrate W is placed on a placing surface of the electrostatic chuck 20. However, the exemplary embodiment is not limited thereto. By way of example, if the placing table 14 does not have the electrostatic chuck 20, the substrate W is placed on the placing surface 18a of the base 18.

An edge ring 25 is provided on a peripheral portion of the base 18 to surround the substrate W. The edge ring 25 is also called a focus ring. This edge ring 25 is configured to improve in-surface uniformity of a plasma processing upon the substrate W. The edge ring 25 may be made of, but not limited to, silicon, silicon carbide or quartz.

Within the base 18, a path 19 is formed along the placing surface 18a. A heat exchange medium is supplied into the path 19 via a pipeline 22a from a chiller unit (not shown) provided at an outside of the chamber 10. Below, the description will be provided for an example where the heat exchange medium is a coolant. The coolant flows through the pipeline 22a and is supplied into the path 19 from an inlet opening 19c. The coolant then flows to an outlet opening 19d and is returned back into the chiller unit 22 via a pipeline 22b. In the substrate processing apparatus 1, a temperature of the substrate W placed on the electrostatic chuck 20 is adjusted by a heat exchange between the coolant and the base 18. In the following, a reference numeral 19a refers to a top surface of the path 19, and a reference numeral 19b denotes a bottom surface of the path 19.

The substrate processing apparatus 1 is equipped with a gas supply line 24. A heat transfer gas (e.g., a He gas) from a heat transfer gas supply mechanism is supplied into a gap between the top surface of the electrostatic chuck 20 and a rear surface of the substrate W through the gas supply line 24.

The substrate processing apparatus 1 is further equipped with an upper electrode 30. The upper electrode 30 is provided above the placing table 14. The upper electrode 30 is supported at an upper portion of the chamber main body 12 with a member 32 therebetween. The member 32 is made of a material having insulation property. The upper electrode 30 and the member 32 close a top opening of the chamber main body 12.

The upper electrode 30 may include a ceiling plate 34 and a supporting body 36. A bottom surface of the ceiling plate 34 is a surface facing the internal space 10s, and it forms and confines the internal space 10s. The ceiling plate 34 is formed of a low-resistance conductor or semiconductor having low Joule's heat. The ceiling plate 34 is provided with multiple gas discharge holes 34a which are formed through the ceiling plate 34 in a plate thickness direction.

The supporting body 36 is configured to support the ceiling plate 34 in a detachable manner. The supporting body 36 is made of a conductive material such as, but not limited to, aluminum. A gas diffusion space 36a is provided within the supporting body 36. The supporting body 36 is provided with multiple gas holes 36b which extend downwards from the gas diffusion space 36a. The multiple gas holes 36b respectively communicate with the multiple gas discharge holes 34a. Further, the supporting body 36 is provided with a gas inlet opening 36c. The gas inlet opening 36c is connected to the gas diffusion space 36a. A gas supply line 38 is connected to this gas inlet opening 36c.

A valve group 42, a flow rate controller group 44 and a gas source group 40 are connected to the gas supply line 38. The gas source group 40, the valve group 42 and the flow rate controller group 44 constitute a gas supply unit. The gas source group 40 includes a plurality of gas sources. The valve group 42 includes a plurality of opening/closing valves. The flow rate controller group 44 includes a plurality of flow rate controllers. Each of the flow rate controllers belonging to the flow rate controller group 44 may be a mass flow controller or a pressure control type flow rate controller. Each of the gas sources belonging to the gas source group 40 is connected to the gas supply line 38 via a corresponding opening/closing valve belonging to the valve group 42 and a corresponding flow rate controller belonging to the flow rate controller group 44.

In the substrate processing apparatus 1, a shield 46 is provided along the inner wall surface of the chamber main body 12 and an outer side surface of the supporting member 13 in a detachable manner. The shield 46 is configured to suppress an etching byproduct from adhering to the chamber main body 12. The shield 46 may be made of, by way of non-limiting example, an aluminum base member having a corrosion-resistant film formed on a surface thereof. The corrosion-resistant film may be formed of ceramic such as yttrium oxide.

A baffle plate 48 is provided between the supporting member 13 and the sidewall of the chamber main body 12. The baffle plate 48 may be made of, by way of example, an aluminum base member having a corrosion-resistant film (a yttrium oxide film or the like) formed on a surface thereof. The baffle plate 48 is provided with a plurality of through holes. A gas exhaust port 12e is provided at the bottom of the chamber main body 12 under the baffle plate 48. The gas exhaust port 12e is connected with a gas exhaust device 50 via a gas exhaust line 52. The gas exhaust device 50 has a pressure control valve and a vacuum pump such as a turbo molecular pump.

The substrate processing apparatus 1 is further equipped with a first high frequency power supply 62 and a second high frequency power supply 64. The first high frequency power supply 62 is configured to generate a first high frequency power. The first high frequency power has a frequency suitable for plasma formation. The frequency of the first high frequency power is in a range from, e.g., 27 MHz to 100 MHz. The first high frequency power supply 62 is connected to the base 18 via a matching device 66 and the electrode plate 16. The matching device 66 is equipped with a circuit configured to match an output impedance of the first high frequency power supply 62 and an impedance at a load side (base 18 side). Further, the first high frequency power supply 62 may be connected to the upper electrode 30 via the matching device 66. The first high frequency power supply 62 constitutes an example of a plasma generator.

The second high frequency power supply 64 is configured to generate a second high frequency power. A frequency of the second high frequency power is lower than the frequency of the first high frequency power. When the first high frequency power and the second high frequency power are used together, the second high frequency power is used as a high frequency bias power for ion attraction into the substrate W. The frequency of the second high frequency power falls within a range from, e.g., 400 kHz to 13.56 MHz. The second high frequency power supply 64 is connected to the base 18 via a matching device 68 and the electrode plate 16. The matching device 68 is equipped with a circuit configured to match an output impedance of the second high frequency power supply 64 and the impedance at the load side (base 18 side).

Here, plasma may be formed by using only the second high frequency power without using the first high frequency power, that is, by using a single high frequency power. In such a case, the frequency of the second high frequency power may be larger than 13.56 MHZ, for example, 40 MHz. The substrate processing apparatus 1 may not be equipped with the first high frequency power supply 62 and the matching device 66. The second high frequency power supply 64 constitutes an example of a plasma generator.

In the substrate processing apparatus 1, a gas is supplied from the gas supply unit into the internal space 10s to form the plasma. Further, by supplying the first high frequency power and/or the second high frequency power, a high frequency electric field is formed between the upper electrode 30 and the base 18. The generated high frequency electric field forms the plasma.

The substrate processing apparatus 1 may be further equipped with a controller 80. The controller 80 may be a computer including a processor, a storage unit such as a memory, an input device, a display device, a signal input/output interface, and so forth. The controller 80 controls the individual components of the substrate processing apparatus 1. In the controller 80, an operator may input a command or the like through the input device to manage the substrate processing apparatus 1. Further, in the controller 80, an operational status of the substrate processing apparatus 1 can be visually displayed by the display device. Furthermore, control programs and recipe data are stored in the storage unit of the controller 80. The control programs are executed by the processor of the controller 80 to allow various processings to be performed in the substrate processing apparatus 1. The processor executes the control programs and controls the individual components of the substrate processing apparatus 1 according to the recipe data.

[Path]

By flowing the coolant cooled to a preset temperature into the path 19 provided within the base 18, the substrate W is cooled. Since through holes for lift pins or the like exist within the base 18, the path 19 is designed to avoid the through holes or the like. As a result, the path is complicated, and a portion of the path formed to avoid the through holes becomes a singularity of the substrate temperature, resulting in deterioration of heat removal uniformity.

In view of this problem, in the placing table 14 according to the exemplary embodiment, a cross sectional shape of the path 19 in a vertical direction is varied depending on a position of the path 19. In the present exemplary embodiment, the cross sectional shape of the path 19 refers to a shape of a cross section of the path 19 in a direction perpendicular to the placing surface 18a of the base 18.

In the present exemplary embodiment, the cross sectional shape of the path 19 differs depending on the position of the path 19. By way of example, at a portion where heat removal is poor, a cross sectional area of the path 19 is reduced relatively to increase a flow velocity, whereas at a portion where the heat removal is good, the cross sectional area of the path 19 is enlarged relatively to decrease the flow velocity. Accordingly, the heat removal is controlled within the placing surface 18a, so that non-uniformity of the heat removal can be eliminated. Below, a simulation conducted to investigate a relationship between the cross sectional shape of the path 19 of the base 18 and the control over the heat removal uniformity according to the present exemplary embodiment will be described in detail.

[Relational Expression Between Temperature of Placing Surface and Height of Path]

Figure 2A:
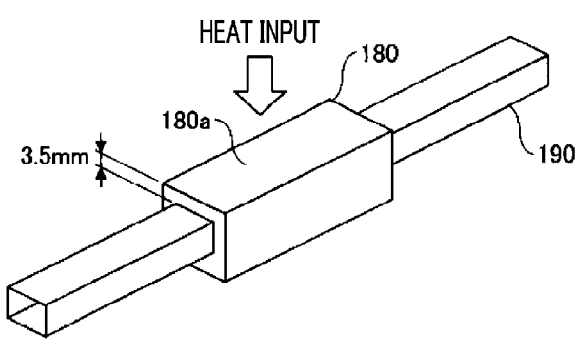
FIG. 2A and FIG. 2B are diagrams illustrating an example of a relational expression between a temperature of a placing surface of a base and a height of a path according to the exemplary embodiment.
Figure 2B:
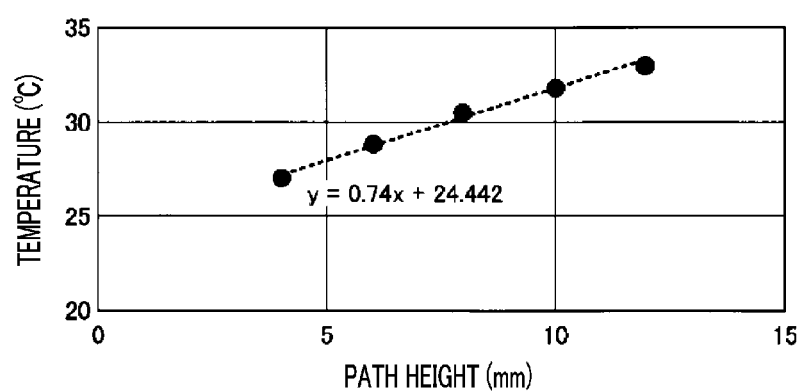

Now, a result of drawing a relational expression between a temperature of the placing surface 18a and a height of the path 19 will be explained with reference to FIG. 2A and FIG. 2B. FIG. 2A and FIG. 2B are diagrams illustrating an example of a relational expression showing a temperature distribution of the placing surface according to the exemplary embodiment.

FIG. 2A shows a simulation model for drawing the relational expression between the temperature of the placing surface 18a and the height of the path 19. In the simulation model, a coolant controlled to 50° C. is flown into a path 190. The path 190 is formed within a base 180 made of aluminum. Heat input from a placing surface 180a of the base 180 is set to be 120° C., and a thickness from the placing surface 180a to the path 190 is set to be 3.5 mm.

FIG. 2B depicts a relational expression between a temperature of the placing surface 18a and a height of the path 19 obtained as a result of conducting the simulation based on the above-specified model and an example of a graph showing this relationship expression. This relational expression is drawn by solving the following equations (continuity equation: Expression 1, momentum equation: Expression 2 (NS equation), energy equation: Expression 3).

[Expression 1]

$$\frac{\partial \rho}{\partial t} + \nabla \cdot (\rho \vec{v}) = S_m \qquad \text{expression (1)}$$

ρ: density
t: time
v: speed
$S_m$: production rate

[Expression 2]

$$\frac{\partial}{\partial t}(\rho \vec{v}) + \nabla \cdot (\rho \vec{v} \vec{v}) = -\nabla p + \nabla \cdot (\bar{\bar{\tau}}) + \rho \vec{g} + \vec{F} \qquad \text{expression (2)}$$

$$\bar{\bar{\tau}} = \mu \left[ (\nabla \vec{v} + \nabla \vec{v}^T) - \frac{2}{3} \nabla \cdot \vec{v} I \right]$$

ρ: density
t: time
v: speed
p: pressure
τ: stress
g: gravitational acceleration
F: force (per unit volume)
μ: viscosity

Figure 3A:
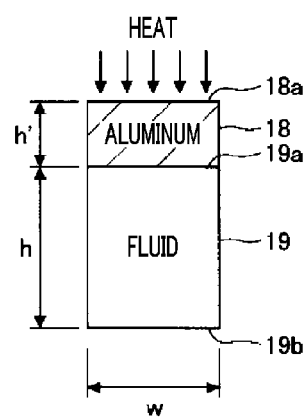
FIG. 3A and FIG. 3B are diagrams for describing a linear relationship between the temperature of the placing surface of the base and the height of the path according to the exemplary embodiment.
Figure 3B:
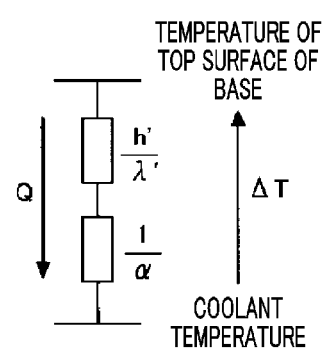

[Expression 3]

$$\frac{\partial}{\partial t}(\rho E) + \nabla \cdot (\vec{v}(\rho E + p)) = \qquad \text{expression (3)}$$

$$\nabla \cdot \left( k_{\mathit{eff}} \nabla T - \sum_j h_j \vec{J}_j + (\bar{\bar{\tau}}_{\mathit{eff}} \cdot \vec{v}) \right) + S_h$$

$$E = h - \frac{p}{\rho} + \frac{v^2}{2}$$

ρ: density
t: time
v: speed
$k_{\mathit{eff}}$: thermal conductivity
T: temperature
h: specific internal energy
$h_j$: external force
$J_j$: displacement (per unit time)
p: pressure
$\tau_{\mathit{eff}}$: stress
$S_h$: heating rate A horizontal axis of FIG. 2B represents the height of the path 19, and a vertical axis thereof indicates the temperature of the placing surface 18a of the base 18. As can be seen from FIG. 2B, there is a linear relationship between the temperature of the placing surface 18a and the height of the path 19, and the relational expression is represented by y=0.74x+24.442. The reason why the relationship between the temperature of the placing surface 18a and the height of the path 19 is linear will be explained with reference to FIG. 3A and FIG. 3B. FIG. 3A and FIG. 3B are diagrams for describing the linear relationship between the temperature of the placing surface 18a of the base 18 and the height of the path 19 according to the exemplary embodiment.

Regarding the structure of the base 18 and the path 19 schematically illustrated in FIG. 3A, assume a case where there is a heat input of a calorific value Q from the placing surface 18a of the base 18 due to the heater or the plasma. A height from the placing surface 18a of the base 18 to a top surface 19a of the path 19 is referred to as h'; a height from the top surface 19a of the path 19 to a bottom surface 19b thereof, h; and a width of the path 19, w.

A temperature difference ΔT, as shown in FIG. 3B, between a temperature of the coolant outputted from the chiller unit and a temperature of the placing surface 18a of the base 18 is calculated as follows by solving a thermal circuit equation per unit area. In the following expressions, a thermal conductivity of the base 18 made of the aluminum is referred to as λ'; a heat transfer coefficient of an interface between the path 19 and the base 18, α; and a composite thermal resistance in the simulation model of FIG. 3A, R. Further, a thermal resistance of the interface between the path 19 and the base 18 is equal to the reciprocal of the heat transfer coefficient α.

$$\Delta T = QR = Q((h'/\lambda') + (1/\alpha)) \qquad \text{Expression (4)}$$

A Reynold number Re is defined by the following Expression (5) if a velocity of the coolant is v, a reference length is L and a kinematic viscosity is μ.

$$Re = vL/\mu \qquad \text{Expression (5)}$$

If a flow rate of the coolant flowing in the path 19 is q, the velocity v of the coolant within the path 19 is represented by the following Expression (6).

$$v = q/hw \qquad \text{Expression (6)}$$

Since the reference length L is a length which contributes to heat removal, the reference length L becomes equal to the height h of the path 19 if the width w of the path 19 is set to be constant. Thus, a relationship of L=h is established.

From the above, the Reynold number Re can be transformed as follows from the Expressions (5) and (6).

$$Re = q/w\mu \qquad \text{Expression (7)}$$

Expression (7) indicates that the Reynold number Re is constant regardless of the height of the path 19.

Further, a Nusselt number Nu is represented by the following Expression (8).

$$Nu = 0.664 Re^{1/2} Pr^{1/3} \qquad \text{Expression (8)}$$

Pr denotes a Prantl number. Since the Reynold number Re is constant regardless of the height of the path 19, Expression (8) indicates that the Nusselt number Nu is constant regardless of the height of the path 19.

The heat transfer coefficient α is represented by the following Expression (9).

$$\alpha = Nu\lambda/h \qquad \text{Expression (9)}$$

Here, λ denotes the thermal conductivity, and Expression (9) indicates that the heat transfer coefficient α is in inverse proportion to the height h of the path 19. If Expression (9) is put into Expression (4), the following Expression (10) is drawn.

$$\Delta T = Q((h'/\lambda') + (h/Nu\lambda)) \qquad \text{Expression (10)}$$

If the height h' from the placing surface 18a of the base 18 to the top surface 19a of the path 19 is constant, the value of h'/λ', which is obtained by dividing the height h' by the thermal conductivity λ of the aluminum (base 18) from the placing surface 18a to the top surface 19a of the path 19, is constant. Accordingly, it is found out from the Expression (10) that the temperature difference ΔT between the temperature of the coolant flowing in the path 19 and the temperature of the placing surface 18a of the base 18 is proportional to the height h of the path 19. From the above, it is found out that the temperature of the placing surface 18a and the height of the path 19 is proportional and is thus in a linear relationship.

[Optimization of Height of Path Based on Relational Expression Between Temperature of Placing Surface and Height of Path]

From the above-described result, in the present exemplary embodiment, the height of the path 19 is determined to achieve temperature uniformity for a temperature distribution of the placing surface 18a by referring to a relational expression between the temperature of the placing surface 18a and the height of the path. That is, in the present exemplary embodiment, a length of the path 19 in a height direction corresponding to a portion of the placing surface 18a where the temperature of the placing surface 18a is relatively high is set to be shorter than a length of the path 19 in the height direction corresponding to a portion of the placing surface 18a where the temperature of the placing surface 18a is relatively low.

The relational expression between the temperature of the placing surface 18a and the height of the path is previously set based on the temperature distribution of the placing surface 18a which is investigated previously. Further, the relational expression between the temperature of the placing surface 18a and the height of the path is an example of information indicating a relationship between the temperature of the placing surface 18a and the height of the path. The information indicating the relationship between the temperature of the placing surface 18a and the height of the path may be stored in the storage unit of the controller 80.

The temperature distribution of the placing surface 18a is determined based on a heater pattern, positions of the through holes, and positions of the inlet opening 19c and the outlet opening 19d, and so forth. Thus, the optimization of the height of the path 19 is carried out based on data of the measured temperature distribution of the placing surface 18a by referring to the relational expression between the temperature of the placing surface 18a and the height of the path 19. That is, the cross sectional area of the path 19 is changed by changing the height of the path 19 at each position from the measured temperature distribution of the placing surface 18a and the relational expression, so that the flow velocity of the coolant is changed. As a result, a heat removal amount is changed, and in-surface uniformity of the temperature of the placing surface 18a can be improved.

The process of determining the height of the path 19 by referring to the relational expression between the temperature of the placing surface 18a and the height of the path 19 is an example of a process of determining the cross sectional shape of the path 19 based on the information indicating the relationship between the temperature of the placing surface 18a and the height of the path 19. The cross sectional area of the path 19 corresponding to the portion of the placing surface 18a having the relatively high temperature may be smaller than the cross sectional area of the path 19 corresponding to the portion of the placing surface 18a having the relatively low temperature. By changing the cross sectional shape of the path 19, the cross sectional area of the path 19 is changed, and, accordingly, the flow velocity of the coolant is changed. As the flow velocity of the coolant is changed, the heat removal amount is changed so that the in-surface uniformity of the temperature of the placing surface 18a can be improved. Here, a width w of the top surface 19a of the path 19 from the inlet opening 19c to the outlet opening 19c is constant.

Now, the optimization of the height of the path based on the relational expression between the temperature of the placing surface and the height of the path and an example of a simulation result will be explained with reference to FIG. 4A and FIG. 4B. FIG. 4A and FIG. 4B are diagrams illustrating the optimization of the height of the path according to the exemplary embodiment and the example of the simulation result.

In this simulation, in a comparative example and an example of the present exemplary embodiment, the width and the shape of the top surface 19a of the path 19 and the distance from the placing surface 18a to the top surface 19a are set to be same, so that a thermal resistance at a heat input side is made equal. Then, in the example of the present exemplary embodiment, a height of the bottom surface 19b of the path 19 is further optimized. To elaborate, in the comparative example of FIG. 4A, the height of the path 19 is set to be constant as 10 mm. In contrast, in the present exemplary embodiment of FIG. 4B, the height of the path 19 is optimized in a range from 5 mm to 14 mm according to the temperature distribution of the placing surface 18a, based on the expression of the graph shown in FIG. 2B.

In this case, the coolant controlled to 50° C. in the chiller unit is flown into the path 19, and by uniformizing a heat generation amount from the heater 20b in the electrostatic chuck 20 as a heat source, a temperature of the electrostatic chuck 20 made of the ceramic is set to be 120° C. According to the simulation result at this time, a temperature difference within the placing surface 18a of the base 18 is reduced to 83% in the present exemplary embodiment shown in FIG. 4B, as compared to the comparative example of FIG. 4A.

In case that there is a heat input to the base 18 from above by the plasma or the heater, a temperature difference between the placing surface 18a and the path 19 is caused due to the thermal resistance and the heat transfer coefficient. That is, there are a temperature difference caused due to the thermal resistance of the base 18 between the placing surface 18a and the top surface 19a of the path 19 when the heat is transferred to the base 18 and a temperature difference caused due to the heat transfer coefficient when the heat is transferred to a fluid within the path 19 from the base 18. In the present exemplary embodiment, as stated above, the thermal resistance of the base 18 between the placing surface 18a and the top surface 19a of the path 19 is made constant, and the thermal transfer coefficient at a time when the heat is transferred to the fluid within the path 19 is adjusted. At this time, the thermal transfer coefficient is proportional to the flow velocity. In the present exemplary embodiment, since it is the height of the path 19 that determines the flow velocity of the coolant when the top surface 19a of the path 19 remains same, the heat transfer coefficient is adjusted by optimizing the height of the path 19, so that non-uniformity in the heat removal can be eliminated.

[Temperature of Placing Surface and Distance from Placing Surface to Path]

(Path Shape and Simulation Result)

Figure 5A:
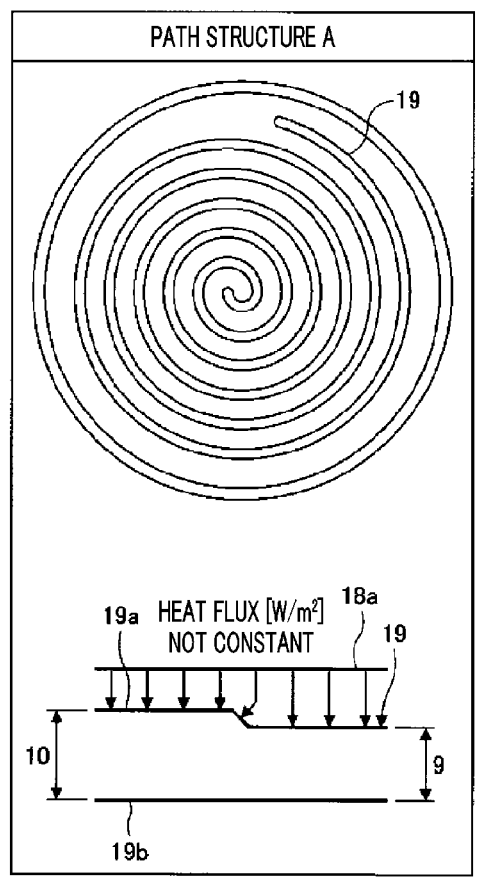
FIG. 5A and FIG. 5B are diagrams illustrating simulation results for a temperature distribution of the placing surface and the height of the path according to the exemplary embodiment.
Figure 5B:
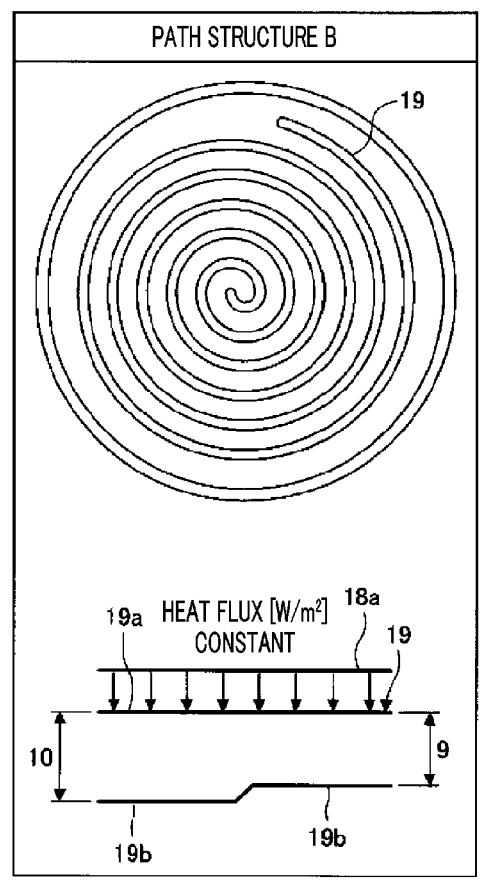

First, a result of a simulation conducted to investigate a temperature distribution of the surface of the base 18 when changing the height of the path 19 as an example of changing the cross sectional shape of the path 19 will be discussed with reference to FIG. 5A and FIG. 5B. FIG. 5A and FIG. 5B are diagrams illustrating an example of a simulation result for a temperature distribution of the placing surface 18a of the base 18 and the height of the path according to the exemplary embodiment.

In a path structure A shown in FIG. 5A and a path structure B shown in FIG. 5B, the path 19 is formed in a spiral shape within the base 18, as respectively illustrated in top views thereof. In the path structure A, the distance between the top surface 19a of the path 19 and the placing surface 18a is not uniform between the inlet opening 19c and the outlet opening 19c for the coolant and differs depending on a height of the top surface 19a. In the path structure B, the top surface 19a of the path 19 has no height variation, and the distance between the top surface 19a of the path 19 and the placing surface 18a is uniform between the inlet opening 19c and the outlet opening 19c for the coolant.

Further, the length of the path 19 in the height direction is designed to increase the flow velocity by reducing the cross sectional area of the path 19 at a position where the heat removal is poor and to decrease the flow velocity at a position where the heat removal is good. To change the height (length) of the path from the top surface 19a to the bottom surface 19b between 10 mm and 9 mm according to the position of the path 19, a step is formed at the top surface 19a of the path 19 in the path structure A, whereas a step is formed at the bottom surface 19b of the path 19 in the path structure B.

In this case, the coolant controlled to 50° C. in the chiller unit is flown into the path 19, and by uniforming the heat generation amount from the heater 20b in the electrostatic chuck 20 as the heat source, the temperature of the electrostatic chuck 20 made of the ceramic is set to be 120° C. In this simulation result, the temperature difference within the placing surface 18a of the base 18 is 5.73° C. at maximum in the path structure A. In contrast, in the path structure B, the temperature difference within the placing surface 18a is 5.16° C. at maximum. Further, though the heater is used as the heat source in the above-described simulation, plasma may be formed and heat may be input to the placing table 14 from this plasma.

As can be seen from the above-described simulation result, the temperature distribution of the placing surface 18a can be controlled by changing the velocity of the coolant flowing in the path 19 based on the height of the path. Further, the temperature difference within the placing surface 18a is reduced to about 90% in the path structure B in which the top surface 19a of the path 19 is made flat without having a height variation and the step is formed at the bottom surface 19b, as compared to the path structure A in which the bottom surface 19b of the path 19 is made flat without having a height variation and the step is formed at the top surface 19a. That is, the path structure B in which the top surface 19a of the path 19 is made flat without having a height variation and the step is formed at the bottom surface 19b shows higher temperature uniformity of the placing surface 18a than the path structure A in which the bottom surface 19b of the path 19 is made flat without having a height variation and the step is formed at the top surface 19a.

As can be seen from the above-described simulation results, non-uniformity of the heat removal within the base 18 can be eliminated by increasing, at a portion where the heat removal is poor, the flow velocity of the coolant by setting the length of the path 19 in the height direction to be short and by decreasing, at a portion where the heat removal is good, the flow velocity of the coolant by setting the length of the path 19 in the height direction to be long.

Besides, it is also found out that, if the height of the top surface 19a of the path 19 within the base 18 is changed while the height of the bottom surface 19b of the path 19 remains same, the thermal resistance of the base 18 at the input side is changed, so that it is difficult to carry out the temperature control of the substrate.

Further, as shown in the path structure A of FIG. 5A, if the height of the top surface 19a of the path 19 is changed, a singularity of temperature may easily occur with an increase of a power level of the high frequency power applied to the placing table 14, which results in deterioration of the in-surface uniformity of the temperature of the placing surface 18a of the base 18. Thus, in-surface uniformity of the temperature of the substrate W is deteriorated.

As stated above, as shown in the path structure B of FIG. 5B, by fixing the height of the top surface 19a of the path 19 and changing the cross sectional shape of the path 19 such that a direction of a heat flux ($W/m^2$) remains constant, it is possible to improve the in-surface uniformity of the temperature of the placing surface 18a of the base 18.

Path According to Modification Examples

Figures 6A, 6B, 6C, 6D, 6E, 6F, 6G, 6H, 6I, 6J, 6K:
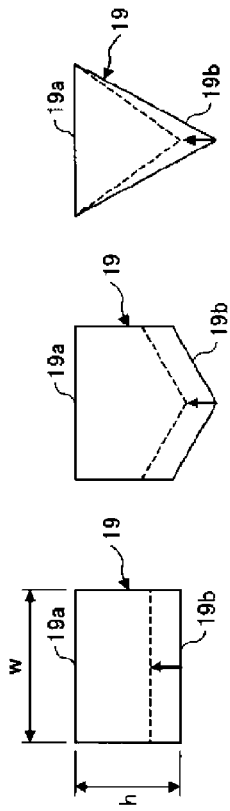
FIG. 6A to FIG. 6K are diagrams illustrating examples of cross sectional shapes of the path according to modification examples.

Now, cross sectional shapes of the path 19 according to modification examples of the exemplary embodiment will be explained with reference to FIG. 6A to FIG. 6K. FIG. 6A to FIG. 6K are diagrams illustrating examples of the cross sectional shapes of the path 19 according to the modification examples of the exemplary embodiment. In FIG. 6A to FIG. 6C, the top surface 19a of the path 19 is flat. In the examples of FIG. 6A to FIG. 6C, the flow velocity is changed by changing the cross sectional shape of the path 19 by means of changing the height of the bottom surface 19b of the path 19 without changing the position of the top surface 19a, and through this changing of the flow velocity, the heat removal in the path 19 is controlled. The bottom surface 19b of the path 19 is not limited to being flat as shown in FIG. 6A but may have inclinations as illustrated in FIG. 6B and FIG. 6C.

In FIG. 6D to FIG. 6G, the top surface 19a of the path 19 has a shape other than a flat shape, such as having an inclination or having a round shape. In the examples of FIG. 6D to FIG. 6G, the flow velocity is changed by changing the cross sectional shape of the path 19 by means of changing the height of the bottom surface 19b of the path 19 without changing the position of the top surface 19a, and through this changing of the flow velocity, the heat removal in the path 19 is controlled. The bottom surface 19b of the path 19 is not limited to being flat as shown in FIG. 6D but may have a shape other than a flat shape, such as inclinations or round shape as illustrated in FIG. 6E to FIG. 6G.

In FIG. 6H to FIG. 6K, the top surface 19a of the path 19 is flat. In the examples of FIG. 6H to FIG. 6K, the flow velocity is changed by changing the cross sectional shape of the path 19 while changing neither the position of the top surface 19a of the path 19 nor the height of the bottom surface 19b of the path 19, and, through this changing of the flow velocity, the heat removal in the path 19 is controlled. The path 19 of FIG. 6H has recesses having a rectangular cross section at both ends of the bottom surface 19b. The path 19 of FIG. 6I has recesses having a triangular cross section at both ends of the bottom surface 19b. The path 19 of FIG. 6J has recesses having a rectangular cross section at side surfaces above both ends of the bottom surface 19b. The path 19 of FIG. 6K has three recesses having a rectangular cross section at the bottom surface 19b.

With the cross sections of the path 19 according to the modification examples of the present exemplary embodiment, it is possible to vary the flow velocity of the coolant by changing the height of the bottom surface 19b or the cross sectional shape of the path 19 without changing the position of the top surface 19a of the path 19, and, thus, it is possible to control the heat removal in the path 19.

The above description has been provided on the assumption that the temperature of the coolant remains same at the inlet opening 19c and the outlet opening 19c when the coolant is supplied into the path 19 from the inlet opening 19c and flown to the outlet opening 19d.

If there is a temperature difference of the coolant between the inlet opening 19c and the outlet opening 19d, it is desirable to optimize the height of the path 19 in consideration of the temperature difference of the coolant. By way of example, in examples of FIG. 7A to FIG. 8C, assume that the temperature of the coolant at the inlet opening 19c of the path 19 within the base 18 is $T_{L1}$, and the temperature of the coolant at the outlet opening 19d is $T_{L2}$. At this time, a temperature difference $\Delta T_L$ of the coolant between the inlet opening 19c and the outlet opening 19d is expressed as $T_{L2}-T_{L1}$.

At this time, in case that the cross sectional area of the path 19 is constant as shown in FIG. 7B, the velocity of the coolant shown in FIG. 7C is constant as well. At this time, a temperature difference between a temperature $T_{w1}$ of an end portion of the substrate W facing the inlet opening 19c and a temperature $T_{w2}$ of an end portion of the substrate W facing the outlet opening 19c is defined as $\Delta T_w$. A heat removal amount in the base 18 shown in FIG. 7A is proportional to the reciprocal of the heat transfer coefficient α at the interface between the base 18 and the path 19 and a value of $\Delta(T_w-T_L)$ which is obtained by deducting the temperature difference $\Delta T_L$ of the coolant from the temperature difference $\Delta T_w$ which is generated from the thermal resistance R from the placing surface 18a to the top surface 19a of the path 19. Here, since the cross sectional shape of the path 19 is constant, the thermal resistance has a constant value (=1/α) between the inlet opening 19c and the outlet portion 19d.

In contrast, as shown in FIG. 8A to FIG. 8C, in case that the height of the bottom surface of the path 19 is the highest at the inlet opening 19c and is lowered toward the outlet opening 19d, the cross sectional area of the path 19 is gradually narrowed from the inlet opening 19c toward the outlet opening 19d, as illustrated in FIG. 8B. In this case, the velocity of the coolant shown in FIG. 8C is the lowest at the inlet opening 19c and gradually increases toward the outlet opening 19d. A heat removal amount in the base 18 shown in FIG. 8A is proportional to reciprocals of heat transfer coefficients α", α' and α at individual positions in the interface between the base 18 and the path 19 and the value of $\Delta(T_w-T_L)$ which is obtained by deducting the temperature difference $\Delta T_L$ of the coolant from the temperature difference $\Delta T_w$ which is generated from the thermal resistance R from the placing surface 18a to the top surface 19a of the path 19. Here, the cross sectional area of the path 19 is narrowed from the inlet opening 19c toward the outlet opening 19d. As a result, since the flow velocity is increased from the inlet opening 19c toward the outlet opening 19d, the reciprocals of the heat transfer coefficients in the path 19 establish a relationship of 1/α">1/α'>1/α between the inlet opening 19c and the outlet opening 19d.

If there is generated the temperature difference $\Delta T_L$ of the coolant between the inlet opening 19c and the outlet opening 19d as stated above, the height of the bottom surface 19b of the path 19 is changed. Accordingly, the heat transfer coefficients α", α' and α at the individual points of the path 19 are controlled such that the temperature $T_{w1}$ of the substrate W becomes constant. Accordingly, by controlling the heat removal amount at each position of the path 19, the in-surface uniformity of the temperature of the substrate W can be further improved. In this case as well, the height of the top surface 19a of the path 19 is maintained constant, and the distance between the top surface 19a of the path 19 and the placing surface 18a is maintained constant in the entire path 19 ranging from the inlet opening 19c to the outlet opening 19d. Accordingly, the thermal resistance R between the top surface 19a of the path 19 and the placing surface 18a is maintained constant.

In addition, the control over the bottom surface of the path according to the present exemplary embodiment may also be applied to a configuration in which a path is provided in the base 18 under the edge ring 25. By way of example, the path may be provided along a placing surface of the base 18 on which the edge ring 25 is placed, and by changing a bottom surface of the path, a flow velocity of the coolant flowing in the path may be controlled, and through this control of the flow velocity of the coolant, a temperature of the edge ring 25 can be controlled to be more uniform. By controlling a flow rate ratio between the coolant flown in the path provided in the base 18 under the edge ring 25 and the coolant flown in the path 19, the in-surface uniformity of the temperature of the substrate W can be further improved.

As stated above, according to the placing table 14 and the substrate processing apparatus 1 of the present exemplary embodiment, it is possible to control the heat removal in the path within the placing table 14. Accordingly, the in-surface uniformity of the temperature of the substrate W can be bettered.

It should be noted that the placing table and the substrate processing apparatus according to the exemplary embodiments of the present disclosure are illustrative in all aspects and are not limiting. Various change and modifications may be made within the scope of the present disclosure. Unless contradictory, the disclosures in the various exemplary embodiments can be combined appropriately.

The substrate processing apparatus of the present disclosure may be applicable to any of various types of apparatuses such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus and a helicon wave plasma (HWP) apparatus.

Further, though the above exemplary embodiments have been described for the case where the plasma processing apparatus is used as an example of the substrate processing apparatus 1, the substrate processing apparatus is not limited to the plasma processing apparatus. By way of example, the substrate processing apparatus 1 may be a heat treatment apparatus configured to heat-treat the substrate W by a heating mechanism such as a heater without forming plasma, for example, a thermal ALD apparatus, a thermal CVD (Chemical Vapor Deposition) apparatus, or the like. Further, the substrate processing apparatus 1 may be an etching apparatus or a film forming apparatus.

According to the exemplary embodiment, it is possible to control the heat removal uniformity in the path within the placing table.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A placing table configured to place a substrate on an electrostatic chuck, comprising:
   a base;
   the electrostatic chuck placed on a placing surface of the base; and
   a path formed within the placing table along the placing surface, and configured to allow a heat exchange medium to flow therein from an inlet opening to an outlet opening of the heat exchange medium,
   wherein a distance between a top surface of the path and the placing surface is constant from the inlet opening to the outlet opening, and
   a cross sectional shape of the path in a direction perpendicular to the top surface is differed depending on a position in the path,
   wherein a cross sectional area of the path corresponding to a first portion of the placing surface having a first temperature is smaller than a cross sectional area of the path corresponding to a second portion of the placing surface having a second temperature which is lower than the first temperature, and
   the cross sectional shape of the path is determined by referring to information indicating a previously set relationship between a temperature of the placing surface and a height of the path.

2. The placing table of claim 1,
   wherein a width of the top surface of the path ranging from the inlet opening to the outlet opening is constant, and
   a length of the path in a height direction is differed depending on a position in the path.

3. A placing table configured to place a substrate on an electrostatic chuck, comprising:
   a base;
   the electrostatic chuck placed on a placing surface of the base; and
   a path formed within the placing table along the placing surface, and configured to allow a heat exchange medium to flow therein from an inlet opening to an outlet opening of the heat exchange medium,
   wherein a distance between a top surface of the path and the placing surface is constant from the inlet opening to the outlet opening, and
   a cross sectional shape of the path in a direction perpendicular to the top surface is differed depending on a position in the path,
   wherein a length of the path in a height direction is determined by referring to information indicating a previously set relationship between a temperature of the placing surface and a height of the path,
   wherein the length of the path in the height direction corresponding to a first portion of the placing surface having a first temperature is shorter than the length of the path in the height direction corresponding to a second portion of the placing surface having a second temperature which is lower than the first temperature.

4. The placing table of claim 3,
   wherein the length of the path in the height direction is determined by varying a height of a bottom surface of the path.

5. A substrate processing apparatus comprising a chamber configured to perform a plasma processing or a heat treatment therein; and a placing table configured to place a substrate on an electrostatic chuck within the chamber,
   wherein the placing table comprises:
   a base;
   the electrostatic chuck placed on a placing surface of the base; and
   a path formed within the placing table along the placing surface, and configured to allow a heat exchange medium to flow therein from an inlet opening to an outlet opening of the heat exchange medium,
   wherein a distance between a top surface of the path and the placing surface is constant from the inlet opening to the outlet opening, and
   a cross sectional shape of the path in a direction perpendicular to the top surface is differed depending on a position in the path,
   wherein a cross sectional area of the path corresponding to a first portion of the placing surface having a first temperature is smaller than a cross sectional area of the path corresponding to a second portion of the placing surface having a second temperature which is lower than the first temperature, and
   the cross sectional shape of the path is determined by referring to information indicating a previously set relationship between a temperature of the placing surface and a height of the path.

* * * * *

UNITED STATES PATENT AND TRADEMARK OFFICE
CERTIFICATE OF CORRECTION

PATENT NO. : 11,791,177 B2
APPLICATION NO. : 16/987650
DATED : October 17, 2023
INVENTOR(S) : Katsuyuki Koizumi et al.

It is certified that error appears in the above-identified patent and that said Letters Patent is hereby corrected as shown below:

In the Specification

Column 10, Line 2, "19c" should be -- 19d --.

Column 11, Line 9, "19c" should be -- 19d --.

Column 11, Line 14, "19c" should be -- 19d --.

Column 13, Line 5, "19c" should be -- 19d --.

Column 13, Line 25, "19c" should be -- 19d --.

Signed and Sealed this
Thirteenth Day of August, 2024

Katherine Kelly Vidal
*Director of the United States Patent and Trademark Office*